United States Patent [19]
Fraas et al.

[11] Patent Number: 5,403,405
[45] Date of Patent: Apr. 4, 1995

[54] SPECTRAL CONTROL FOR THERMOPHOTOVOLTAIC GENERATORS

[75] Inventors: Lewis M. Fraas, Issaquah; John E. Samaras, Seattle, both of Wash.; Paul F. Baldasaro; Edward J. Brown, both of Clifton Park, N.Y.

[73] Assignee: JX Crystals, Inc., Issaquah, Wash.

[21] Appl. No.: 171,426

[22] Filed: Dec. 22, 1993

Related U.S. Application Data

[63] Continuation-in-part of Ser. No. 906,452, Jun. 30, 1992, Pat. No. 5,312,521, and a continuation-in-part of Ser. No. 47,477, Apr. 19, 1993, and a continuation-in-part of Ser. No. 70,668, Jun. 2, 1993.

[51] Int. Cl.$^6$ ............... H01L 31/058; H01L 31/0232
[52] U.S. Cl. .................................... 136/253; 136/257
[58] Field of Search ........................... 136/253, 257

[56] References Cited

U.S. PATENT DOCUMENTS

| | | | |
|---|---|---|---|
| 3,751,303 | 8/1973 | Kittl | 136/253 |
| 4,017,758 | 4/1977 | Almer et al. | 313/112 |
| 4,234,352 | 11/1980 | Swanson | 136/253 |
| 4,331,829 | 5/1952 | Palazzetti et al. | 136/253 |
| 4,776,895 | 10/1988 | Goldstein | 136/253 |
| 4,976,606 | 12/1990 | Nelson | 431/79 |
| 5,044,939 | 9/1991 | Dehlsen | 432/25 |
| 5,091,018 | 2/1992 | Fraas et al. | 136/246 |
| 5,096,505 | 3/1992 | Fraas et al. | 136/246 |
| 5,217,539 | 6/1993 | Fraas et al. | 136/246 |
| 5,248,346 | 9/1993 | Fraas et al. | 136/244 |

FOREIGN PATENT DOCUMENTS 63-316486 12/1988 Japan ............... 136/253

OTHER PUBLICATIONS

H. Höfler et al, *Solar Cells*, vol. 10, pp. 273–286 (Dec. 1983).

H. Höfler et al, *Proceedings, 5th E.C. Photovoltaic Solar Energy Conference*, Athens, Greece, Oct. 1983, pp. 225–229.

Fraas, A. P., Heat Exchanger Design Operating on Radiant Energy, Wiley–Interscience Publication, pp. 265–382 (U.S.A. 1989).

Fraas, A. P., Characteristics of Heat Sources, Engineering Evaluation of Energy Systems, pp. 96–125 McGraw–Hill (U.S.A. 1982).

Morgan, M.D. et al., Radioisotope Thermal Photovoltaic Application of the GaSb Solar Cell, NASA SPRAT Conference, pp. 349–358 (U.S.A. 1989).

Doellner, O. L., Aircraft Photovoltaic Power-Generating System, PhD Thesis University of Arizona, (USA 1991), p. 154.

Fraas, A. P., Design and Development Tests of Direct-Condensing Potassium Radiators, USAEC Report Conf-651026, (U.S.A. 1965).

Tester, et al., Comprative Performance Characteristics of Cylindrical Prabolic and Flat Plate Solar Eneergy Collectros, American Society of Mechanical Engineers, pp. 1–3 (U.S.A. 1974).

Fraas, A. P., Effects of Directed and Kinetic Energy Weapons on Spacecraft, Oak Ridge Nat'l Lab, pp. 1–76 (1986).

Fraas, et al., Summary of the Research and Development Effort on Ceramic Gas Turbines, Oak Ridge National Laboratories, pp. 1–33 (U.S.A. 1977).

*Primary Examiner*—Aaron Weisstuch
*Attorney, Agent, or Firm*—James Creighton Wray

[57] ABSTRACT

In the present invention, a thermophotovoltaic electric power generator is described. It contains low bandgap photovoltaic cells sensitive in the infrared out to at least 1.7 microns and a broadband infrared emitter with a shortpass IR filter located between the cells and the emitter to recycle the nonuseful IR back to the emitter. Several specific IR filter designs as well as filter/cell and filter/emitter combinations are described all of which improve the overall generator conversion efficiency.

20 Claims, 6 Drawing Sheets

OTHER PUBLICATIONS

Howe, E. E. et al., The Characteristics of Atmospheric-Type Burners when Used with Natural Gas, Transactions of the A.S.M.E., pp. 673–677 (U.S.A. 1940).

Fraas, A. P., Magneto-Hydrodynamic Systems, Engineering Evaluation of Energy Systems, pp. 437–461, McGraw-Hill, Inc., 1982.

Day, A. C., et al., Application of the GaSb Solar Cell in Isotope-Heated Power Systems, Conference Record, 21st IEEE Photovoltaic Specialists Conf. Kissimmee, pp. 1320–1325, Fla., 1990.

Kittl and Guazzoni, Design Analysis of TPV-Generator System, Proc. 25th Annual Power Sources Conf., pp. 106–110 (U.S.A. 1972).

Woolf, L. D., Optimum Efficiency of Single and Multiple Bandgap Cells in Theromphotovoltaic Energy Conversion, Solar Cells, 19, pp. 19–20 (U.S.A. 1986–87).

Macleod, H. A., Thin Film Optical Filters, Chapter 6, McGraw-Hill Publishing Co., (1989).

SPECTRAL CONTROL FOR THERMOPHOTOVOLTAIC GENERATORS

BACKGROUND OF THE INVENTION

This application is a continuation-in-part of U.S. patent application Ser. No. 07/906,452, filed Jun. 30, 1992, now U.S. Pat. No. 5,312,521. This application is also a continuation-in-part of U.S. patent application Ser. Nos. 08/047,477, and 08/070,668, filed Apr. 19, 1993, and Jun. 2, 1993, respectively. These earlier applications and their listed references are incorporated herein by reference.

Various attempts to fabricate practical and economical thermophotovoltaic (TPV) power generators have been reported over the years. However, generator designs based on the use of silicon photovoltaic cells have been unsuccessful because of a requirement for very high temperature emitters (T>2300K). Without very high temperature emitters, TPV systems based on silicon cells are both inefficient and operate at low power densities. Selective emitters based on rare earth oxides have been described (M. K. Goldstein, U.S. Pat. No. 4,776,895) which improve efficiencies but still suffer from low power densities at practical emitter temperatures. Low power density generators are not economical for large volume energy production.

In 1989, L. M. Fraas et al. described a new GaSb photovoltaic cell sensitive in the infrared (IR) out to 1.7 microns. Later in 1990, M. D. Morgan, W. E. Horne, and A. C. Day proposed using GaSb cells in combination with a radioisotope thermal source for space electric power. In 1991, O. L. Doellner proposed using GaSb cells looking at jet engine plumes to replace alternators on jet aircraft. Finally in 1992, A. P. Fraas and R. M. Fraas submitted U.S. patent application Ser. No. 07/906,452 describing a small quiet natural gas fired TPV generator using GaSb and GaInSb cells.

The advantage of the GaSb cell over previous silicon cells can be quantified by reference to tables of performance projections contained in Doellner's Ph.D. thesis. For example, for a 2000K blackbody emitter, the electric power density produced by a GaSb cell is 12.35 Watts/cm$^2$. This is 4.4 times higher than the 2.83 Watts/cm$^2$ produced by a silicon cell. However, although much more power is absorbed and converted by the GaSb cell, there is still a lot of power emitted by the 2000 K blackbody that is not absorbed. For example, at 2000K, the GaSb cell receives for conversion 32.8 Watts/cm$^2$ of the available 90.7 Watts/cm$^2$. Thus, only 36% of the energy from the blackbody is usable. At lower temperatures, even a smaller fraction of the blackbody spectrum is usable. For example, the usable fraction absorbed falls to 25% for a blackbody at 1700K. This problem is addressed in the earlier applications (Ser. Nos. 07/906,452, 08/047,477, & 08/070,668) by placing a short-pass IR filter between the GaSb thermophotovoltaic cell and the emitter. This shortpass filter passes the useful IR on to the cell and reflects the nonuseful longer wavelength IR back to the emitter thereby avoiding unnecessary heat loss. Avoiding this heat loss both increases generator conversion efficiency and simplifies the cell heat removal requirement.

Several approaches to short-pass filter design are available from the prior art. Multilayer dielectric filters are well known (Thin Film Optical Filters, H. A. Macleod (1989), Chapter 6). However, the reflection-band range for dielectric filters is quite limited. Large amounts of energy still pass in the long wavelength IR region. Polycrystalline conducting oxide "plasma" filters serve as short pass filters (Heat Mirror Coatings for Energy Conserving Windows, Carl M. Lampert, *Solar Energy Materials*, Vol. 6 (1981, pp. 1–41). However, these "plasma" filters have gradual transitions from the transmitting to reflecting wavelength intervals as well as plasma absorption resulting in major energy losses. Tandem filters combining these two types of filters (low mobility "plasma" and dielectric) have also been proposed for use with 3000K incandescent electric light bulbs (Almer, 1977, U.S. Pat. No. 4,017,758). However, these light bulb filters are designed for transmitting visible light rather than short wavelength IR as required for thermophotovoltaic generator applications. The light bulb tandem filters using low mobility polycrystalline conducting oxide films become quite lossy when the plasma wavelength is tuned to wavelengths beyond 1.7 microns. Almer does not discuss filter absorption losses in the IR. Needs exist to provide new filters for the thermophotovoltaic application. Needs exist to provide a new heat source, IR filter, and TPV cell combination for providing improved heat to electrical conversion efficiency.

SUMMARY OF THE INVENTION

The present invention relates to thermophotovoltaics and more particularly to the use of new low bandgap GaSb, GaInSb, or Ge photovoltaic cells sensitive to IR radiation down to at least 1.7 microns. These new cells allow the use of lower temperature (e.g. 1700K) ceramic broadband thermal emitters. These new low bandgap cells can be wired in series strings and combined with hydrocarbon fired burner/emitter designs to create a variety of practical TPV electric generators. One such small TPV generator can serve as a compact, quiet, light weight, and clean burning DC electric power supply for off-grid electric power for mountain cabins or third world village homes. A larger 10 kW unit could be used as a power system in hybrid electric vehicles where it could run cleaner and at higher efficiency than the internal combustion engine and reduce battery size and weight.

The energy conversion efficiency of thermophotovoltaic systems using low bandgap cells in combination with broadband thermal emitters can be dramatically increased by using appropriate shortpass IR filters to transmit the useful IR to the low bandgap photovoltaic cells and to reflect the non useful IR back to the broadband thermal emitter. This invention describes several specific IR filter/TPV generator combinations. Calculations show that a GaSb cell in combination with a 1700K blackbody emitter and an ideal short-pass filter can convert 39% of the emitter energy into electricity whereas the same GaSb cell in combination with the same 1700K emitter without a filter would convert only 9.8% of the energy into electricity. The details of this IR filter design are very important and are a subject of this patent application.

For some TPV generator configurations, there is a need for an IR filter designed to operate at high temperatures. One such high temperature dielectric filter is described herein in which optically thin layers of silicon nitride serve as diffusion barriers between high index silicon layers and low index silicon dioxide layers.

For thermal emitters operating at temperatures of 1700K or below, there is a need for a very broadband IR filter with low absorption losses. Five tandem filter configurations are described, all of which use high mobility "plasma" layers to minimize absorption losses in the long wavelength IR. In two of these tandem configurations, the IR filters are integrally combined with the photovoltaic cell.

Finally, we note that IR filter performance can be improved by using a gray body emitter rather than a black body emitter, where the IR emitted in the longer wavelength ranges is lowered through the use of an appropriate emitter glazing such as cobalt oxide.

DETAILED DESCRIPTION OF PREFERRED EMBODIMENTS

Figure 1:
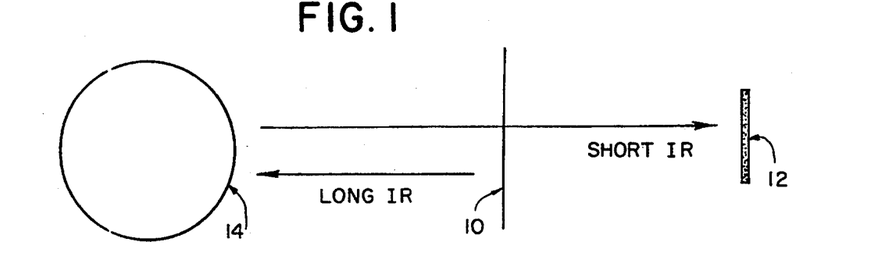
FIG. 1: Relevant TPV configuration with shortpass infrared (IR) filter located between the broadband IR emitter and the TPV cell.
Figure 2:
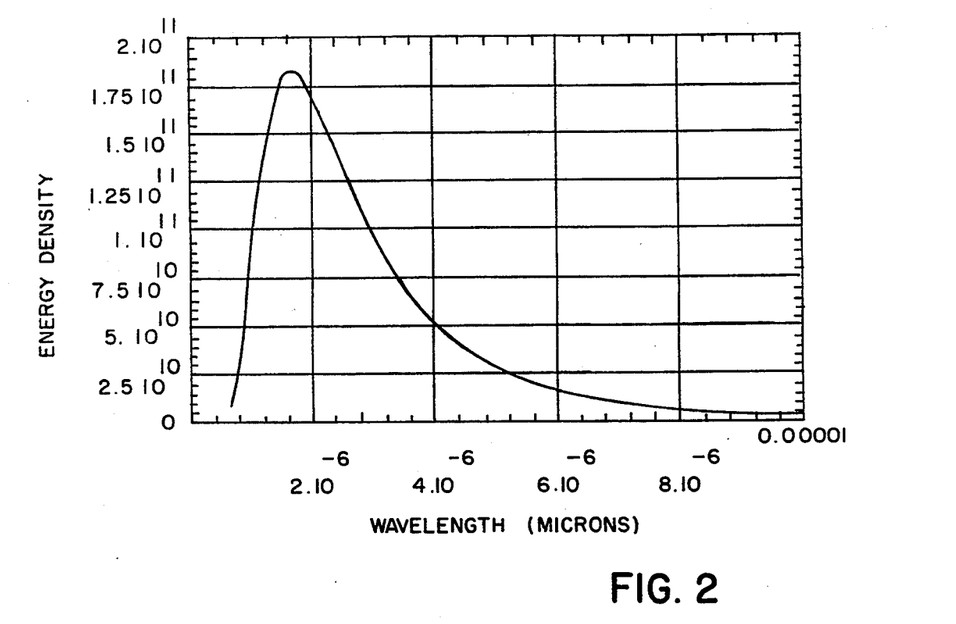
FIG. 2: Exemplary blackbody energy spectrum for 1700K emitter.

FIG. 1 shows the generalized TPV configuration of interest in this patent application. A short pass IR filter, 10, is located between a low bandgap TPV cell, 12, and a broadband thermal emitter, 14. For the purposes of this application, the low bandgap TPV cell is any cell with a bandgap between 0.83 eV and 0.4 eV. Our exemplary calculations will be for GaSb cells with a bandgap of 0.72 eV and for a blackbody thermal emitter operating at 1700K. The infrared wavelength, $\lambda_G$, corresponding to 0.72 eV is 1.72 microns. FIG. 2 shows the energy spectrum for a blackbody at 1700K. The energy content in this spectrum peaks at an infrared wavelength of 1.7 microns. For a GaSb cell, an ideal IR filter would be a step function filter with a transition from 0 to 100% reflectivity for wavelengths longer than 1.72 microns. In our discussions herein, we will design filters for a transition at 1.72 microns. However, it should be understood that similar filter designs are to be included within this patent application for other low bandgap cells simply by sliding the transition wavelength (or cell bandgap wavelength, $\lambda_G$ using the following formula:

$$\lambda_G = 1.24(\text{micron } eV)/E_g \quad (1)$$

For example, if a TPV cell with a bandgap energy (Eg)=0.5 eV were to be used, the transition wavelength will become 2.48 microns.

Several realistic IR filter designs are described herein. Table 1 summarizes the efficiency projections calculated for each of these filters given an emitter temperature of 1700K and a GaSb TPV cell. The efficiency numbers fall between the ideal-filter case of 39% and the no-filter case of 9.8%.

Table 1: Summary of TPV conversion efficiencies for various filter options.

TABLE 1

| Filter Type | TPV Filter Performance TPV Efficiency* |
|---|---|
| None | 9.8% |
| Dielectric Filter | 20% |
| Plasma Filter | 16% |
| Tandem Filter | 23% |
| Tandem Filter / Cell | 26% |
| Tandem Filter / Cell with Grey Body | 30% |
| Ideal Filter | 39% |

*1700 K Emitter

Figure 3:
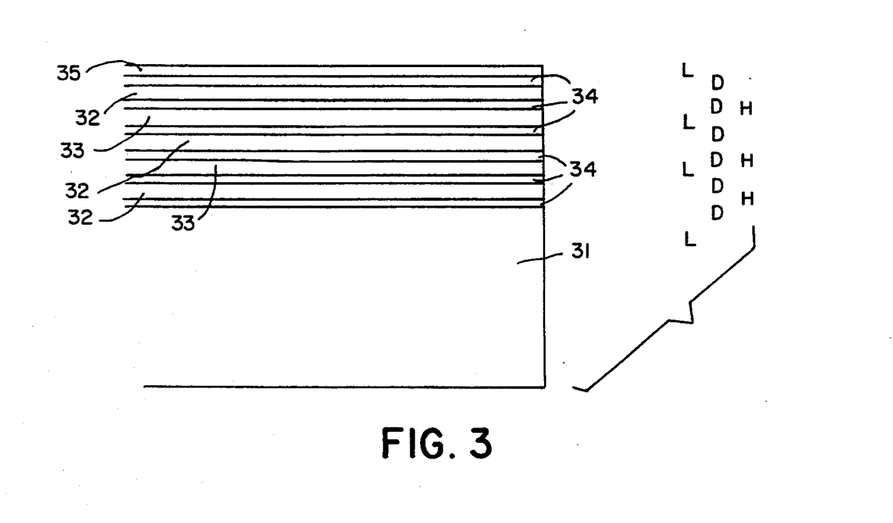
FIG. 3: Multilayer structure for a high temperature dielectric filter.
Figure 4:
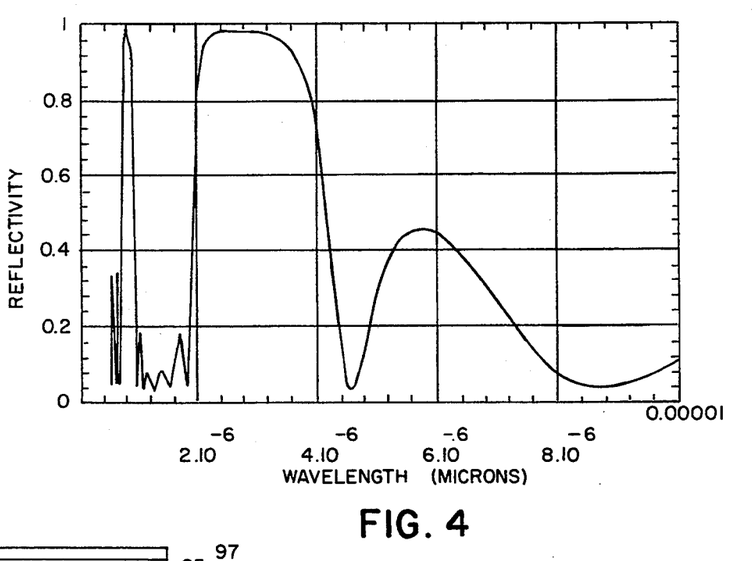
FIG. 4: Reflectance spectrum for the dielectric filter shown in FIG. 3.

FIGS. 3 and 4 show a dielectric filter design and its associated reflectivity spectrum. The dielectric filter shown in FIG. 3 is designed specifically for thermophotovoltaic applications. It consists of alternating film pairs of high and low refractive index. Silicon is used for the high index layers, 32. Although not typically used for filters in the visible because of absorption, it is usable here because it is transparent in the IR. Silicon dioxide layers, 33 & 35, are used as the low index layers. The dielectric filter consists of an outer eighth wave low index layer, 35, followed by quarter wave high index layers, 32, alternating with quarter wave low index layers, 33, where the wavelength refers to the center of the stop band at approximately 1.5 $\lambda_G$. The filter substrate, 31, may be either glass or another transparent material as appropriate.

For some TPV generator designs, the IR filter mounted between the emitter and cells will run hot. Therefore, it is necessary to locate optically thin silicon nitride layers, 34, between the silicon, 32, and silicon dioxide, 35, layers as diffusion barriers thereby allowing long term filter stability.

An additional feature of this filter design is in its ease of fabrication. Note that silicon is a common constituent throughout, making this filter readily producible through several methods commonly used in the semiconductor industry. For example, the required layers can be deposited in a sputtering chamber using a single silicon target and introducing nitrogen or oxygen gases at the appropriate times. Similarly, the layers can be deposited using reactive evaporation from a silicon source. Plasma enhanced or low pressure CVD methods can also be used.

Referring to Table 1, note that this dielectric filter can improve the TPV conversion efficiency to 20%. Referring to FIG. 4, this improvement results from reflecting a large portion of the IR in the 2 to 4 microns band back to the emitter. However, note that the average reflectivity for this filter in the 4 to 10 microns band is only approximately 20%. So, a lot of IR energy is lost in this longer wavelength band.

Figure 5:
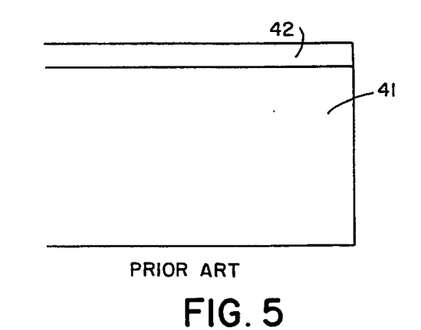
FIG. 5: Conducting oxide "plasma" filter.
Figure 6:
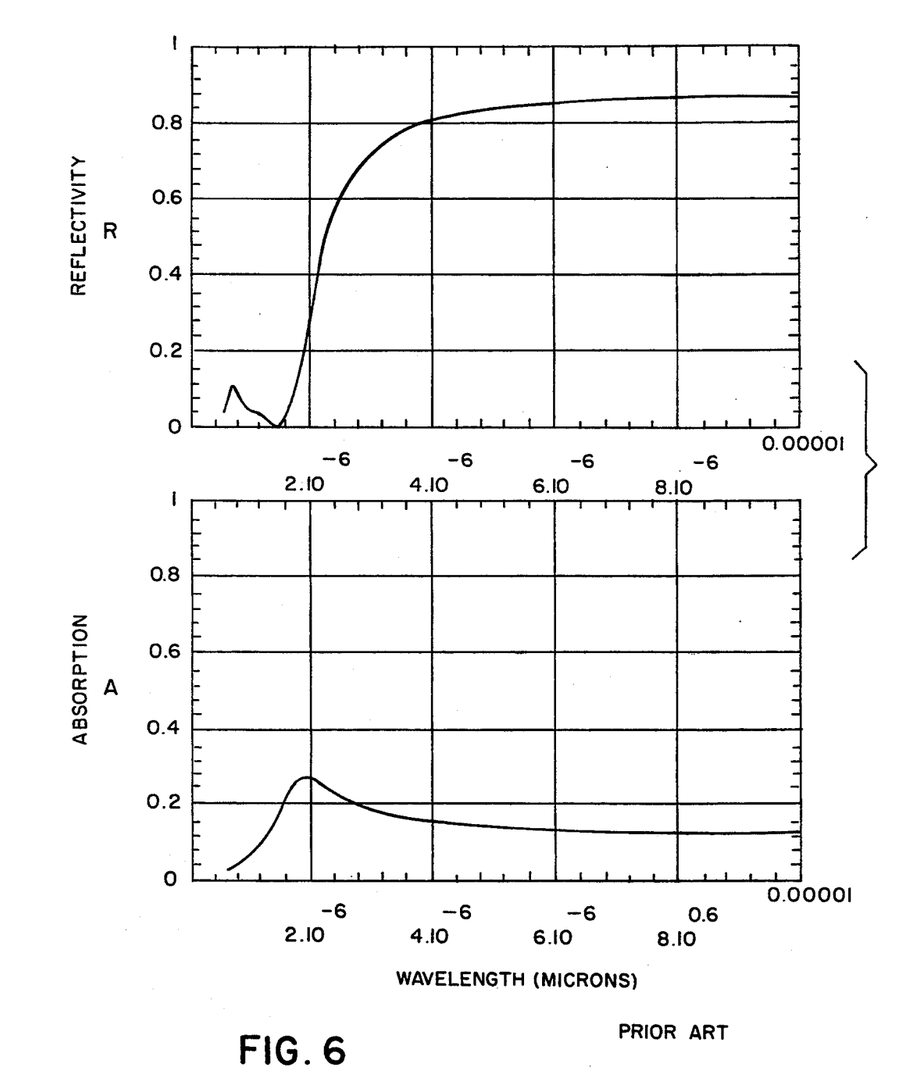
FIG. 6: Reflectance and absorbance spectra for a "plasma" filter.

FIG. 5 shows a prior art "plasma" filter consisting of a polycrystalline conductive oxide film such as indium tin oxide 42 deposited on a glass substrate 41 and FIG. 6 shows reflection and absorption spectra for this filter.

The electrons (or free carriers) in an ideal "plasma" filter act cooperatively to reflect all wavelengths longer than the wavelength associated with the plasma frequency given by:

$$\omega_p = (4\pi N e^2 / m^* \epsilon_v)^{\frac{1}{2}} \quad (2)$$

where $\omega_p$ is the plasma frequency, N is the free carrier concentration, $m^*$ is the free carrier effective mass, and $\epsilon_v$ is the dielectric constant for the material.

However, there are losses in a real plasma associated with electron collisions. These collisions produce a wide absorption band at the plasma frequency with absorption continuing throughout the longer wavelength range and a gradual transition from transmission to reflection. The width of the plasma absorption band is given by $\gamma$ with $(1/\gamma)$ equal to the free carrier relaxation time. The free carrier mobility, $\mu$, is the film parameter directly related to $\gamma$ through the following expression:

$$1/\gamma = m^* \mu / e \quad (3)$$

Higher values of $\mu$ lead to less absorption and sharper transitions. The typical mobility in the "plasma" filters used for visible light transmission applications such as that described by Almer is less than 50 cm$^2$/V sec. Herein, we target mobility ($\mu$) values of 70 cm$^2$/V sec or higher.

The reflection and absorption spectra shown in FIG. 6 are for a plasma film with a mobility of 70 cm$^2$/V sec. Table 1 shows that the TPV efficiency for this "plasma" filter of 16% is inferior to the efficiency of the simple dielectric filter. The reasons for this are over 20% absorption at 1.7 microns and poor reflectivity below 3 microns wavelengths. Although this prior art "plasma" filter looks good at long wavelengths, poor performance in the 1.5 to 3 microns range dominates because most of the blackbody energy falls in this range.

Figure 7:
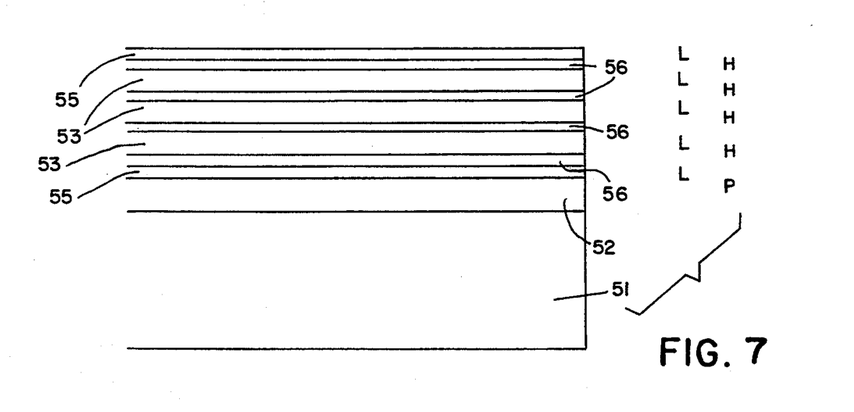
FIG. 7: Tandem filter with high mobility "plasma" film.

FIG. 7 shows a tandem IR filter structure consisting of a high mobility "plasma" film, 52, located between the substrate, 51, and a dielectric filter consisting of low index, 53, 55, and high index, 56, films. The dielectric filter consists of eighth wave low index, 55, layers at the transitions, and quarter wave high index, 56, layers alternating with quarter wave low index, 53, layers where the wavelength refers to the center of the stop band at approximately 1.5 $\lambda_G$. The dielectric filter provides for a rapid transition from transmission to reflection at $\lambda_G$ microns. The carrier concentration in the plasma filter is chosen in order to locate the plasma wavelength at approximately 1.5 $\lambda_G$ so that absorption in the pass band at $<\lambda_G$ is minimized. The "plasma" film quality is maximized in order to provide for a high mobility. One or more means of maximizing the plasma film mobility can be used as follows:

1.) The doping concentration is optimized to minimize ionized impurity scattering. For example, in indium tin oxide, the tin concentration is reduced relative to the conventional indium tin oxide used for visible light filter applications.

2.) Scattering defects are reduced through appropriate film anneals. In the case of indium tin oxide, the stoichiometry is optimized through appropriate air and vacuum anneals.

3.) The crystal quality of the plasma film can be enhanced by the use of single crystal substrates. For example, indium tin oxide can be deposited on a sapphire substrate. Alternately, zinc oxide can be deposited on a sapphire substrate.

Figure 8:
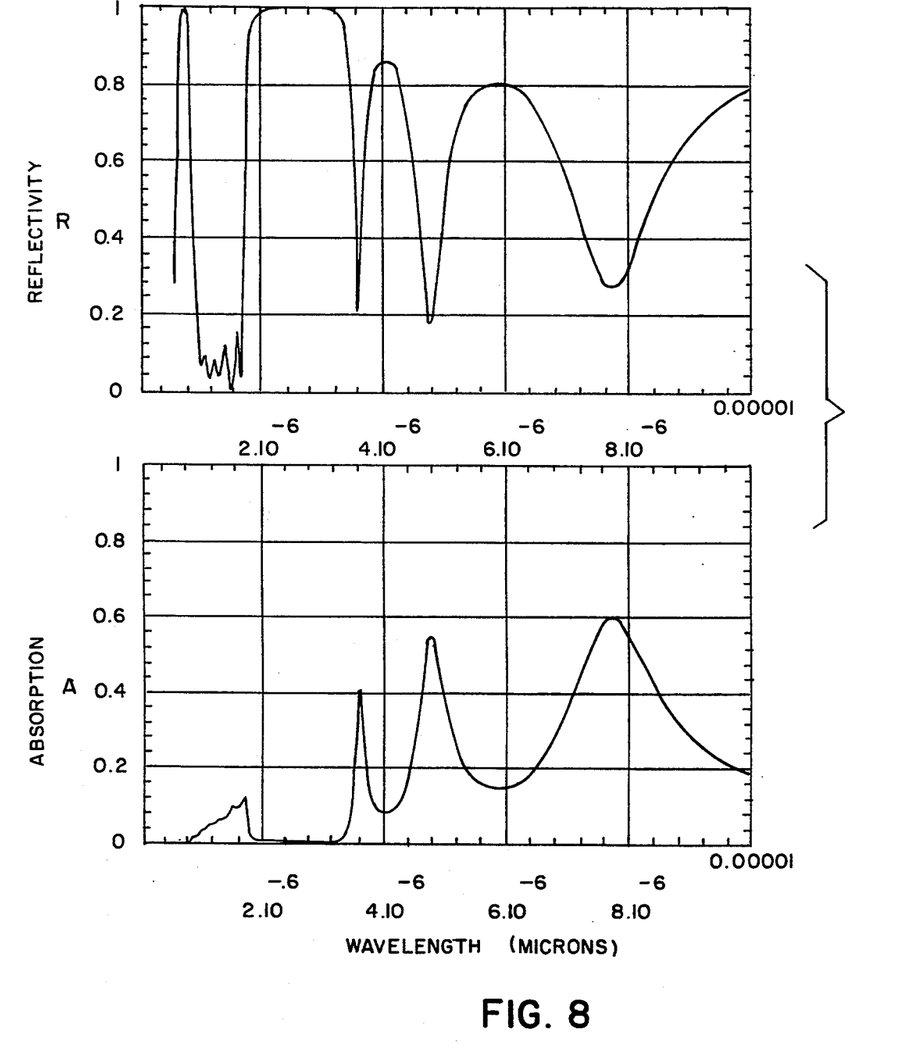
FIG. 8: Reflectance and absorbance spectra for the tandem filter shown in FIG. 7.

FIG. 8 shows the reflection and absorption spectra for a tandem filter containing a plasma film with a mobility of 70 cm$^2$/V sec. As Table 1 indicates, the TPV conversion efficiency has now improved to 23%. Comparing the reflection spectra in FIGS. 4 and 8 shows that the improvement results from increasing the average reflectivity in the 4 to 10 microns range from 20% to 55% by adding the plasma filter. Note that this tandem filter can be deposited directly on a TPV cell, in which case the TPV cell is the substrate, 51.

Figure 9:
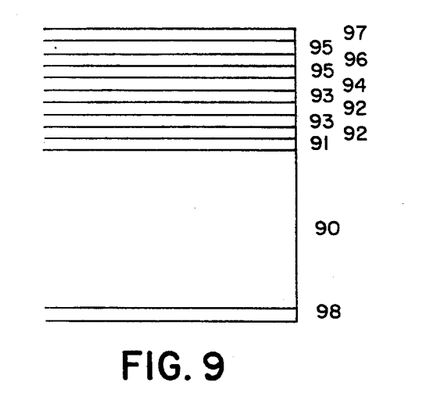
FIG. 9: Tandem filter with high mobility "plasma" layer within a single crystal substrate surface.

FIG. 7 showed a plasma film deposited on a substrate but an alternative means of obtaining a high mobility plasma is to locate the plasma filter layer within the substrate surface. For example, if a silicon substrate is used, a heavily doped surface plasma layer can be produced by ion implantation or diffusion of an appropriate donor or acceptor into a silicon wafer. FIG. 9 shows a tandem filter structure with the plasma filter layer located within the surface of a single crystal silicon wafer. FIG. 9 shows the plasma filter and the dielectric filter on the front side of the substrate facing the TPV emitter. Note, however, that it is alternatively possible to locate the plasma layer on the back side of the substrate.

A tandem filter structure built up on a single crystal silicon wafer is shown in FIG. 9. A lightly doped silicon wafer, 90, serves as a substrate. The surface facing the IR emitter is heavily doped to form a high mobility plasma filter layer, 91. Typical properties of this layer are a doping concentration of 4×10$^{20}$/cc, a thickness of 0.2 microns, and a mobility of 100 cm$^2$/V sec. A multilayer dielectric filter consisting of layers 92 through 97 is then deposited on top of the silicon wafer. In a preferred embodiment, layers 92, 94, 96, and 97 are low index silicon dioxide layers with the intermediate layers 93 and 95 being high index silicon layers. Layers 92 and 93 are quarter wave layers with reflection centered at 2.4 microns and layers 95 and 96 are quarter wave layers with reflections centered at 3.0 microns. The structure is completed with a quarter layer antireflection layer 98 on the back of the silicon wafer centered in the transmission band at 1.4 microns.

Figure 10:
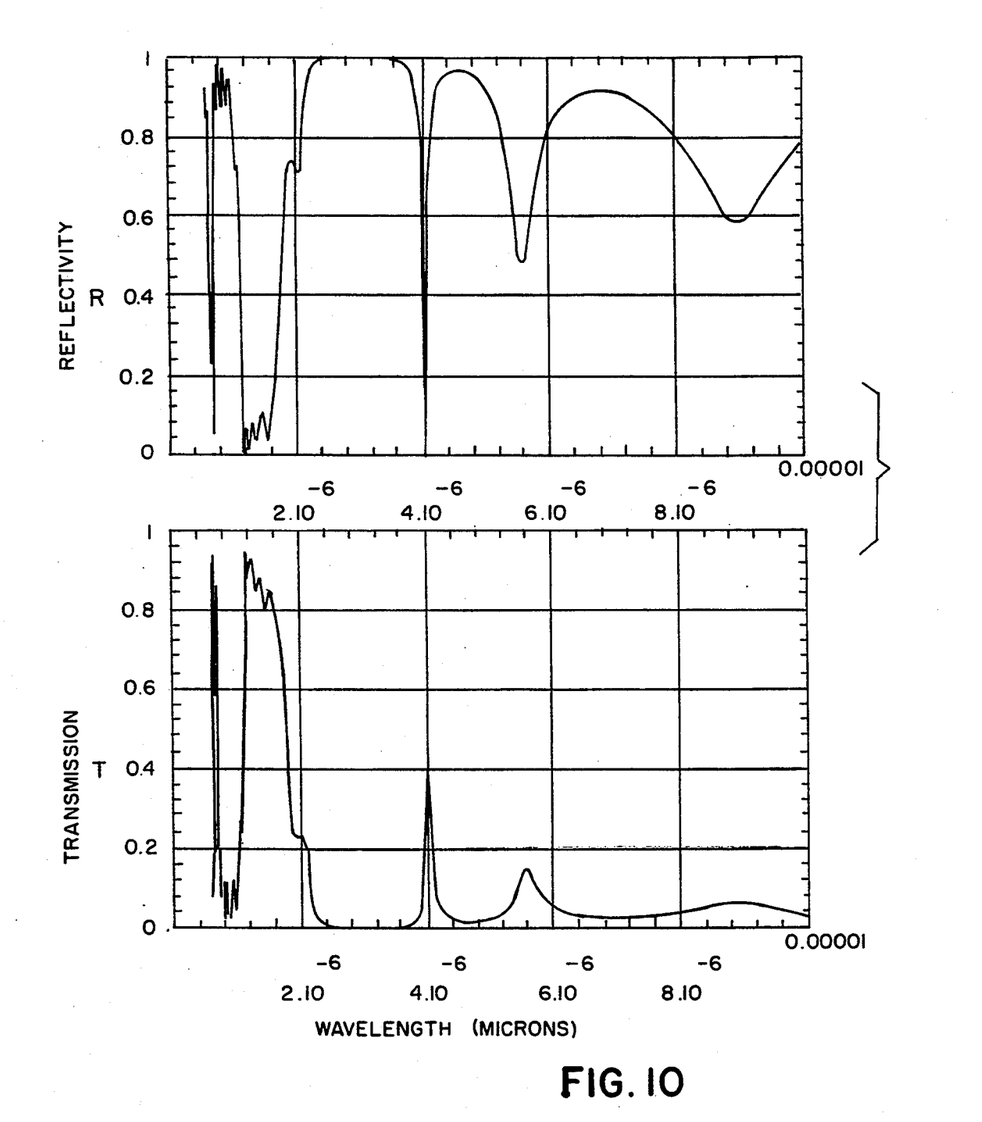
FIG. 10: Reflectance and transmission spectra for the tandem filter shown in FIG. 9.

FIG. 10 shows the reflection and transmission spectra for the resultant tandem filter. It has high transmission for useful wavelengths between 1.1 and 1.8 microns with high reflection in the longer wavelength regions.

As the reflection and transmission spectra shown in FIG. 10 indicate, substantial improvements in tandem filter performance result from still further increases in the plasma film mobility. The spectra shown are for a plasma film mobility of 100 cm$^2$/V sec. Note that the average reflectance in the 4 to 10 microns range has now increased to 75%.

Figure 11:
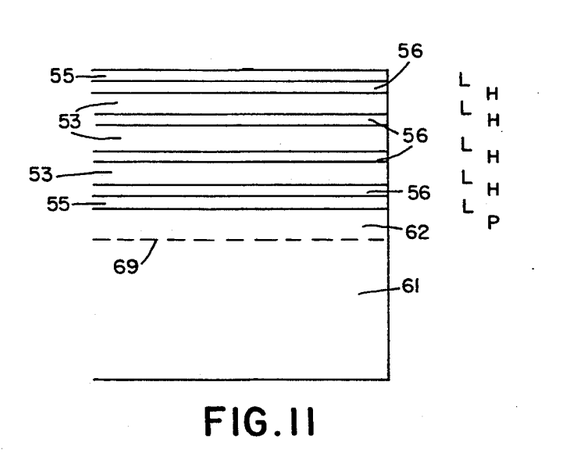
FIG. 11: Type 1 TPV cell with integral tandem filter.
Figure 12:
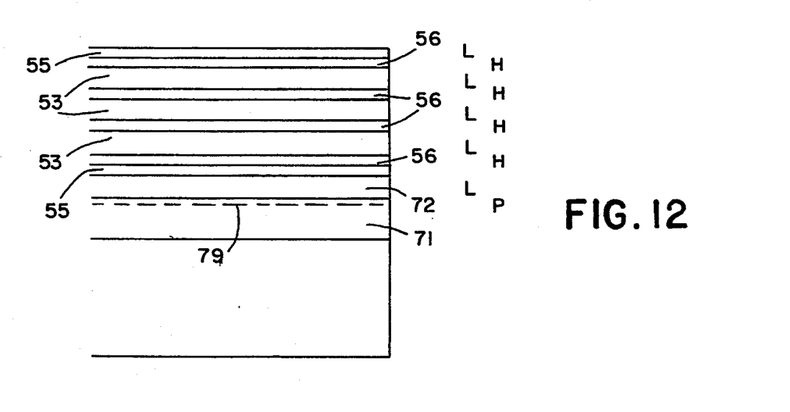
FIG. 12: Type 2 TPV cell with integral tandem filter.

An increase in mobility to over 100 cm$^2$/V sec can only result by using single crystal plasma layers. Single crystal plasma layers can be epitaxially deposited on transparent single crystal substrates in a FIG. 7 filter configuration. Alternatively, since the photovoltaic cell is fabricated from single crystal material, it is possible to build a single crystal plasma layer into the top of a thermophotovoltaic cell. FIGS. 11 and 12 show two ways in which this can be done.

FIG. 11 shows a simple type 1 cell in which the plasma layer, 62, is a heavily doped material identical in major constituents with the homojunction cell. Using the GaSb cell as an example, the plasma layer, 62, could be the p+ GaSb layer forming the top of the cell with the n type GaSb substrate, 61, forming the base of the cell with the diode junction, 69, located between 62 and 61. This layer could be formed by diffusion or ion implantation. The doping level would be tuned for a plasma wavelength set to 2.5 microns.

FIG. 12 shows a type 2 cell in which the plasma layer 72 is a window layer. As an example, an InP window layer, 72, on an InGaAs TPV cell, 71 (junction 79), could be appropriately doped to locate the plasma wavelength at 2.5 microns.

As Table 1 indicates, the TPV conversion efficiency for a tandem filter with a plasma layer mobility of 100 cm$^2$/V sec increases to 26%.

Figure 13:
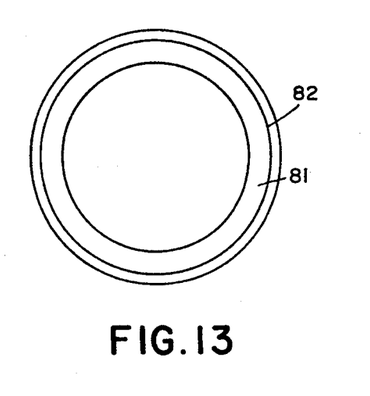
FIG. 13: Gray body emitter with cobalt oxide glazing.
Figure 14:
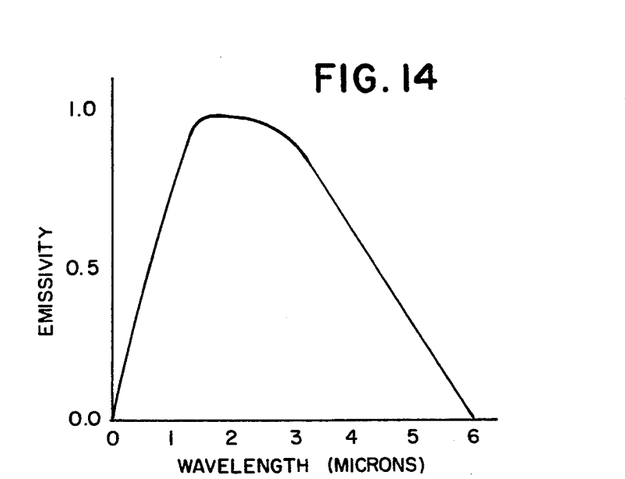
FIG. 14: Emissivity vs wavelength graph of emitter of FIG. 13.

Note that the filter losses are now in the 4 to 10 microns region. Further system improvements are possible by reducing the IR emitted in this wavelength interval while simultaneously maintaining a high emissivity for shorter wavelengths. FIGS. 13 and 14 show one means of accomplishing this. Cobalt oxide has a high emissivity in the 0.6 to 3 microns interval with a lower emissivity in the 3 to 10 microns range. As Table 1 indicates, if a cobalt oxide glazing, 82, is deposited on a low emissivity ceramic base, 81, to form a gray body emitter which is then combined with a high mobility tandem filter, the TPV conversion efficiency can rise to 30%.

Various changes and alterations may be made without parting from the spirit of the invention disclosed herein. All changes and modifications which fall within the scope of the claims and equivalents thereof are intended to be embraced thereby.

We claim:

1. A thermophotovoltaic electric power generator consisting of low bandgap thermophotovoltaic cells and a broadband infrared (IR) emitter with shortpass IR filters located between said low bandgap cells and said IR emitter, with said thermophotovoltaic cells sensitive to wavelengths less than a characteristic wavelength, $\lambda_G$, with $\lambda_G$ lying between 1.5 and 3.1 microns, where said shortpass filters are multilayer dielectric filters containing several layers with alternating high and low refractive index, said dielectric filter being designed to transmit wavelengths between 0.6 $\lambda_G$ and 1.0 $\lambda_G$ and reflect wavelengths between $\lambda_G$ and 2.0 $\lambda_G$, said dielectric filter having been designed to survive at high temperatures by inserting thin diffusion barrier layers between said high and low refractive index layers.

2. The generator of claim 1 wherein the high and low refractive index layers in the IR filter are silicon and silicon dioxide layers, respectively, and the diffusion barrier layers are silicon nitride layers.

3. A thermophotovoltaic electric power generator consisting of low bandgap thermophotovoltaic cells and a broadband infrared (IR) emitter with shortpass IR filters located between said low bandgap cells and said IR emitter, with said thermophotovoltaic cells sensitive to wavelengths less than a characteristic wavelength, $\lambda_G$, with $\lambda_G$ lying between 1.5 and 3.1 microns, where said shortpass filters are tandem filters containing a multilayer dielectric filter deposited on top of a plasma filter with said multilayer dielectric filter consisting of several layers with alternating high and low refractive index, said dielectric filter being designed to transmit wavelengths between 0.6 $\lambda_G$ and 1.0 $\lambda_G$ and reflect wavelengths between $\lambda_G$ and 2.0 $\lambda_G$, said plasma filter consisting of a conductive film with a plasma wavelength set between $\lambda_G$ and 2.0 $\lambda_G$.

4. The generator of claim 3 wherein the high and low refractive index layers in the multilayer dielectric filter are silicon and silicon dioxide layers, respectively.

5. The generator of claim 3 wherein the conductive film in the plasma filter is a layer of indium tin oxide.

6. The generator of claim 3 wherein the conductive film in the plasma filter is a layer of zinc oxide.

7. The generator of claim 3 wherein the conductive film in the plasma filter has a free carrier mobility of at least 70 cm$^2$/V sec thereby increasing the filter reflectivity and decreasing aborption losses in the >2.0 $\lambda_G$ wavelength interval.

8. A thermophotovoltaic cell containing a short pass IR tandem filter fabricated on its illuminated surface with said thermophotovoltaic cell sensitive to wavelengths less than a characteristic wavelength, $\lambda_G$, where said shortpass filters are tandem filters containing a multilayer dielectric filter deposited on top of a plasma filter with said multilayer dielectric filter consisting of several layers with alternating high and low refractive index, said dielectric filter being designed to transmit wavelengths between 0.6 $\lambda_G$ and 1.0 $\lambda_G$ and reflect wavelengths between $\lambda_G$ and 2.0 $\lambda_G$, said plasma filter consisting of a conductive film with a plasma wavelength set between $\lambda_G$ and 2.0 $\lambda_G$.

9. The thermophotovoltaic cell of claim 8 with said thermophotovoltaic cells sensitive to wavelengths less than a characteristic wavelength, $\lambda_G$, with $\lambda_G$ lying between 1.5 and 3.1 microns.

10. The TPV cell of claim 8 wherein the high and low refractive index layers in the multilayer dielectric filter are silicon and silicon dioxide layers, respectively.

11. The TPV cell of claim 8 wherein the conductive film in the plasma filter is a layer of indium tin oxide.

12. The TPV cell of claim 8 wherein the conductive film in the plasma filter is a layer of zinc oxide.

13. The TPV cell of claim 8 wherein the conductive film in the plasma filter has a free carrier mobility of at least 70 cm$^2$/V sec thereby increasing the filter reflectivity and decreasing aborption losses in the >2.0 $\lambda_G$ wavelength interval.

14. The thermophotovoltaic cell of claim 8 wherein the conductive film in the plasma filter is a single crystal layer.

15. The thermophotovoltaic cell of claim 8 wherein the conductive film in the plasma filter is a single crystal layer which is itself also a junction forming layer for the thermophotovoltaic cell.

16. A thermophotovoltaic electric power generator consisting of low bandgap thermophotovoltaic cells and a broadband infrared (IR) emitter with shortpass IR filters located between said low bandgap cells and said IR emitter, with said thermophotovoltaic cells sensitive to wavelengths less than a characteristic wavelength, $\lambda_G$, with $\lambda_G$ lying between 1.5 and 3.1 microns, where said shortpass filters are tandem filters containing a multilayer dielectric filter deposited on top of a plasma filter with said multilayer dielectric filter consisting of several layers with alternating high and low refractive index, said dielectric filter being designed to transmit wavelengths between 0.6 $\lambda_G$ and 1.0 $\lambda_G$ and reflect wavelengths between $\lambda_G$ and 2.0 $\lambda_G$, said plasma filter with a plasma wavelength set between $\lambda_G$ and 2.0 $\lambda_G$ consisting of a heavily doped surface layer located within a single crystal semiconducting substrate.

17. The generator of claim 16 wherein the high and low refractive index layers in the multilayer dielectric filter are silicon and silicon dioxide layers, respectively.

18. The generator of claim 16 wherein the plasma filter is a heavily doped silicon surface layer and the substrate is a lightly doped silicon wafer.

19. A thermophotovoltaic electric power generator consisting of low bandgap thermophotovoltaic cells and a broadband infrared (IR) emitter with shortpass IR filters located between said low bandgap cells and said IR emitter, with said thermophotovoltaic cells sensitive to wavelengths less than a characteristic wavelength, $\lambda_G$, with $\lambda_G$ lying between 1.5 and 3.1 microns, wherein said broadband IR emitter consists of a gray body emitter with an average emissivity over 75% for wavelengths shorter than 3 microns while having an average emissivity of less than 50% for wavelengths from 3 to 10 microns.

20. The thermophotovoltaic electric power generator of claim 19 wherein said broadband gray body emitter consists of a cobalt oxide glazed aluminum oxide emitter.

* * * * *